United States Patent
Shimada

(10) Patent No.: US 7,138,339 B2
(45) Date of Patent: Nov. 21, 2006

(54) METHOD OF MANUFACTURING SEMICONDUCTOR DEVICE INCLUDING ETCHING A CONDUCTIVE LAYER BY USING A GAS INCLUDING $SICL_4$ AND $NF_3$

(75) Inventor: Hiroyuki Shimada, Kofu (JP)

(73) Assignee: Seiko Epson Corporation (JP)

( * ) Notice: Subject to any disclaimer, the term of this patent is extended or adjusted under 35 U.S.C. 154(b) by 169 days.

(21) Appl. No.: 10/678,994

(22) Filed: Oct. 3, 2003

(65) Prior Publication Data

US 2004/0110376 A1    Jun. 10, 2004

(30) Foreign Application Priority Data

Oct. 4, 2002   (JP)   ............... 2002-292277
May 8, 2003   (JP)   ............... 2003-130757

(51) Int. Cl.
   *H01L 21/302*   (2006.01)
(52) U.S. Cl. ............... 438/720; 438/585; 438/714
(58) Field of Classification Search ............... 438/706, 438/710, 714, 719, 720, 721, 722, 585, 586, 438/587
   See application file for complete search history.

(56) References Cited

U.S. PATENT DOCUMENTS

| | | | |
|---|---|---|---|
| 5,100,505 A | 3/1992 | Cathey, Jr. ................... | 156/643 |
| 5,508,209 A * | 4/1996 | Zhang et al. ................ | 438/162 |
| 5,648,277 A * | 7/1997 | Zhang et al. ................ | 438/151 |
| 6,261,406 B1 * | 7/2001 | Jurgensen et al. ........ | 156/345.3 |
| 6,372,633 B1 * | 4/2002 | Maydan et al. ............. | 438/637 |
| 6,503,845 B1 * | 1/2003 | Nallan ........................ | 438/714 |
| 6,593,634 B1 * | 7/2003 | Ohmi et al. ................ | 257/412 |
| 6,646,352 B1 * | 11/2003 | Ohmi et al. ................ | 257/763 |
| 6,773,996 B1 * | 8/2004 | Suzawa et al. ............. | 438/279 |
| 2002/0006705 A1 | 1/2002 | Suzawa et al. ............. | 438/279 |

FOREIGN PATENT DOCUMENTS

| | | |
|---|---|---|
| JP | 05-102090 | 4/1993 |
| JP | 11-168212 A | 6/1999 |
| JP | 2000-208519 | 7/2000 |
| JP | 2000-298192 | 10/2000 |
| JP | 2000-298193 | 10/2000 |
| JP | 2001-298193 | * 10/2001 |
| JP | 2002-050636 | 2/2002 |
| JP | 2002-083805 | 3/2002 |
| JP | 2003-163194 | 6/2003 |

\* cited by examiner

*Primary Examiner*—Kin-Chan Chen
(74) *Attorney, Agent, or Firm*—John J. Penny, Jr.; George N. Chaclas; Edwards Angeli Palmer & Dodge, LLP

(57) ABSTRACT

A method of manufacturing a semiconductor device comprising forming an insulating layer above a semiconductor layer, forming a conductive layer including at least tantalum and tantalum nitride, and etching the conductive layer with using a gas including $SiCl_4$ and $NF_3$.

5 Claims, 11 Drawing Sheets

METHOD OF MANUFACTURING SEMICONDUCTOR DEVICE INCLUDING ETCHING A CONDUCTIVE LAYER BY USING A GAS INCLUDING SICL$_4$ AND NF$_3$

BACKGROUND OF THE INVENTION

1. Technical Field of the Invention

The present invention relates to a method of etching a conductive layer including at least one of tantalum and tantalum nitride. In particular, it relates to a method of etching a metal including at least any one of tantalum and tantalum nitride to form a metal gate.

2. Related Art

In an insulated gate type field effect transistor (MISFET) currently used in a semiconductor integrated circuit, a polycrystalline silicon layer doped with high-density impurity for lower register is used as a gate electrode. However, it is well known that, even if a polycrystalline silicon layer constituting a gate electrode is doped with high-density impurity, an area in the side of an insulated layer of a gate is depleted at the time of channel inversion. If such depletion is occurred, this becomes equivalent to connecting a capacitance to a gate electrode in series such that effective potential applied to a channel is decreased. As a result, the capability of the driving current of MISFET is decreased. In order to overcome this problem a metal is used as a gate electrode material, which has a low resistance and prevents a gate from being depleted.

Japanese Patent Laid-Open No. 11-168212 discloses a method in which tantalum is used as a metal gate electrode. Further, this document discloses that the gate electrode is formed by anisotropic-etching the tantalum film with SiCl$_4$ plasma (the paragraph 0015). However, the present inventor confirmed that, when tantalum film is anisotropic-etched by only SiCl$_4$, some parts of it remained on a substrate without being etched uniformly so as to take longer time to etch them completely.

In addition, the Japanese Patent Laid-Open No. 2002-83805 discloses that a refractory metal layer or a layer alloyed with these metals is etched by a chlorine group gas and a fluorine group gas to form a gate electrode. In this technique, a sidewall of a gate electrode is tapered by etching. A cross-sectional shape of the tapered gate electrode has a lower portion having a width that is larger than that of an upper portion. In addition, in this technique, a tapered gate electrode is used as a mask such that an impurity is doped with self-alignment (the paragraph 0028). Furthermore, in this technique, a combination of Cl$_2$ with CF$_4$ (the table 1 in the paragraph 0065) or a combination of Cl$_2$ with SF$_4$ (the table 2 of the paragraph 0103) is employed as gas for dry etching. This reference also teaches to use a chlorine gas such as SiCl$_4$ and a fluorine gas such as NF$_3$ in a fourth dry etching step. However, this technique is directed to process a gate electrode to be tapered such that it is impossible to process a sidewall of a gate electrode to be vertical or nearly vertical.

Furthermore, the Japanese Patent Laid-Open No. 5-102090 discloses that a metal layer such as aluminum is etched by using etching materials including coating compositions and chemical etching components. In this technique, a sidewall of a metal layer is processed to be vertical or tapered. The cross-sectional shape of a tapered gate electrode has a lower portion having a width that is larger than that of a upper portion. (FIG. 3, FIG. 4 and others). This technique allows a metal being processed as tapered. However there is no detail description of forming a vertical sidewall of a metal layer under necessary conditions. Furthermore, there is no description of forming a vertical sidewall of a metal layer including at least tantalum and tantalum nitride.

SUMMARY OF THE INVENTION

The present invention is directed to a process of manufacturing a semiconductor device, where a conductive layer including at least one of tantalum and tantalum nitride formed on a insulating layer, is anisotropic-etched so as to be vertical or nearly vertical.

A process of manufacturing a semiconductor device of the present invention comprises;

forming an insulating layer above a semiconductor layer;

forming a conductive layer including at least one of a tantalum layer and a tantalum nitride layer; and etching the conductive layer by using a gas including SiCl$_4$ and NF$_3$.

According to the present invention, when etching a conductive layer including at least a tantalum layer and a tantalum nitride layer, the sidewall of such conductive layer can be etched vertically or almost vertically by using a gas including SiCl$_4$ and NF$_3$. The present inventor found that the etching rate of NF$_3$ has a low dependency on crystal surface, compared with a material including chlorine, etching can be done at a uniform rate in any crystal surfaces. On the other hand, SiCl$_4$ has an undesirable characteristic of relatively high dependency on crystal surface, . Therefore, mixing SiCl$_4$ with NF$_3$ can attain quick etching to form a favorite configuration of a conductive layer including a tantalum layer and a tantalum nitride layer while maintaining the high selective rate regarding an insulated layer. Here, "favorite configuration" means that a sidewall of the patterned conducting layer is not tapered and vertical or almost vertical instead. Further "almost vertical" means that the angle between the sidewall of a etched conductive wall and the surface of a insulating layer installed below the conductive layer is 85° to 90°, preferably 89° to 90°. Such property of etching a conducting layer with a favorite configuration is similar to other modes of the present invention.

A process of manufacturing a semiconductor device of the present invention comprises;

forming an insulating layer above a semiconductor layer;

forming a conductive layer including at least one of a tantalum layer and a tantalum nitride layer;

etching the conductive layer by using a gas including NF$_3$ and fluorocarbon; and etching the conductive layer by using a gas including SiCl$_4$ and NF$_3$.

The present invention can attain quick etching with a favorite configuration of a conductive layer including a tantalum layer and a tantalum nitride layer while maintaining the high selective rate regarding a insulated layer. Further, time for etching can be shortened. This is because etching of a conductive layer is divided into two stages such that a fluorocarbon having high etching rate of a conductive layer compared with another gas is used in a first stage.

A process of manufacturing a semiconductor device of the present invention comprises;

forming an insulating layer above a semiconductor layer;

forming a first tantalum nitride layer, body centered cubic lattice phase tantalum layer and a second tantalum nitride layer in this order;

forming a gate electrode by etching the first nitride tantalum layer, the body centered cubic lattice phase tantalum layer and the second nitride tantalum layer using a gas including $SiCl_4$ and $NF_3$; and forming first and second impurity layers constituting a source region and a drain region through introducing a impurity into the semiconductor layer.

In the present invention, tantalum nitride layer is formed close to a gate-insulating layer. The work function of tantalum nitride is about 4.5 eV, which is extremely close to the intrinsic mid gap energy of silicon; 4.61 eV. As a result, the increase of the absolute value of flatband potential regarding a MOS capacitor composed of a metal-silicon-metal is small and the difference between this absolute values of a N channel insulating gate field effect transistor and a P channel insulating gate field effect transistor can be fairly reduced. Therefore, with respect to a complementary semiconductor device provided with a N-channel insulating gate field effect transistor and a P channel insulating gate field effect transistor having complete depletion type SOI structure, the threshold balance between the both can be controlled precisely and easily.

DETAILED DESCRIPTION OF THE INVENTION

Next, the preferred embodiment of the present invention is described in detail referring to drawings.

Figure 1:
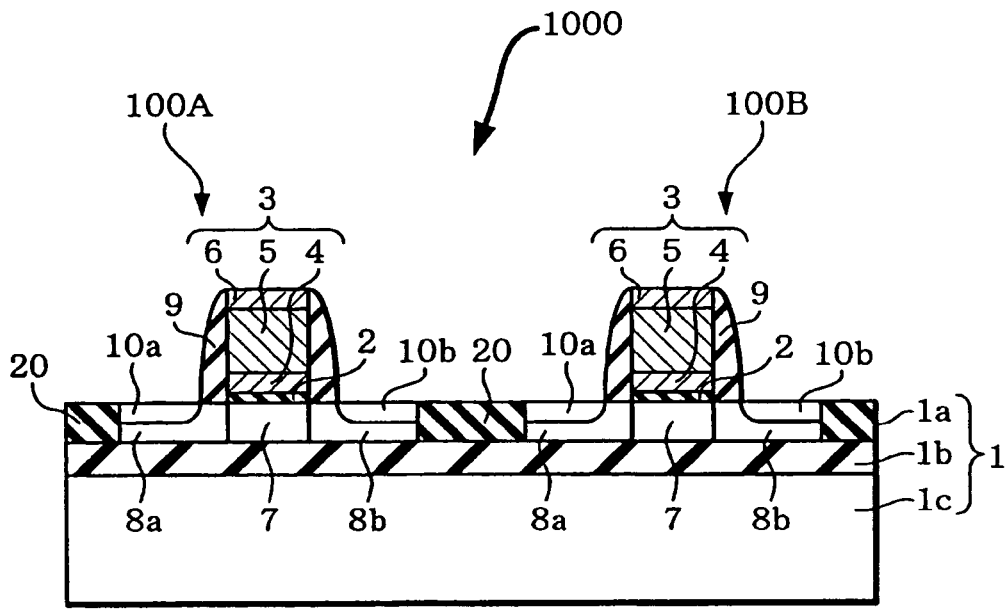
FIG. 1 is a cross sectional view showing a semiconductor device provided by a manufacturing method related to the preferred embodiment.

FIG. 1 shows the schematic sectional view of a semiconductor device 1000 obtained by a manufacturing method of a present embodiment of the present invention. The semiconductor device 1000 is a CMOS type semiconductor device, including a N-channel insulating gate field effect transistor (N MOS FET) 100A and a P channel insulating gate field effect transistor (P MOS FET) 100B. The NMOSFET 100A and the PMOSFET 100B are formed on a SOI (Silicon On Insulator) substrate 1. The SOI substrate 1 constitutes multi layers including an insulating layer (a silicon oxide layer) 1b and a semiconductor layer 1a. In this embodiment, the semiconductor layer 1a is a silicon layer. In addition, a semiconductor layer may be a bulk semiconductor substrate.

Further, the NMOSFET 100A is electrically separated from the PMOSFET 100B by an element-isolating region 20 formed in a silicon layer 1a of the SOI substrate 1.

The MOSFET 100A and the PMOSFET 100B have a structure where a multi layered type gate electrode 3 is formed above the silicon layer 1a via a gate-insulating layer 2. This multi layered type gate electrode 3 comprises a tantalum nitride layer 4, a tantalum layer having a body centered cubic lattice phase 5 and a tantalum nitride 6 as a cap layer in this order. In addition, in this present embodiment, tantalum of a body centered cubic lattice phase may be referred to as a tantalum or bcc-Ta (body centered cubic-Ta). In addition, a channel region 7 is formed directly below the gate insulating layer 2 and impurity layers 8a and 8b are formed at both ends of a channel region 7 to constitute a source region or a drain region.

Further, in the NMOSFET 100A, impurity layers 8a and 8b are N type, impurity layers 8a and 8b in the PMOSFET 100B are P type. Silicide layers 10a and 10b are formed on the upper part of impurity layers 8a and 8b, respectively.

Next, a method of manufacturing the semiconductor device 1000 is described referring to FIG. 2 to FIG. 6.

Figure 2:
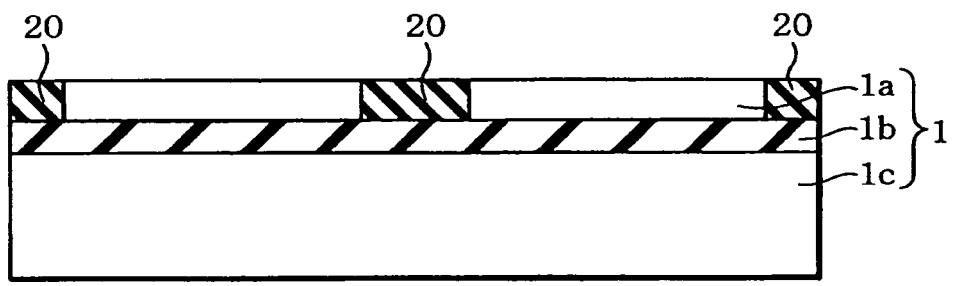
FIG. 2 is a cross sectional view showing a method of manufacturing a semiconductor device related to the preferred embodiment.

(a) The SOI substrate 1 where an insulating layer (a silicon oxide layer) 1b and a P type silicon layer 1a of low density are deposited, is provided on the supporting substrate 1c. The P type silicon layer 1a has, for example, a thickness; 50 nm, a resistivity; 14–26 Ω/cm and a plane direction; (100). At first, as shown in FIG. 2, the element-isolating region 20 is formed in a P type silicon layer 1a. The element-isolating region 20 is formed by STI (Shallow Trench Isolation) method.

Figure 3:
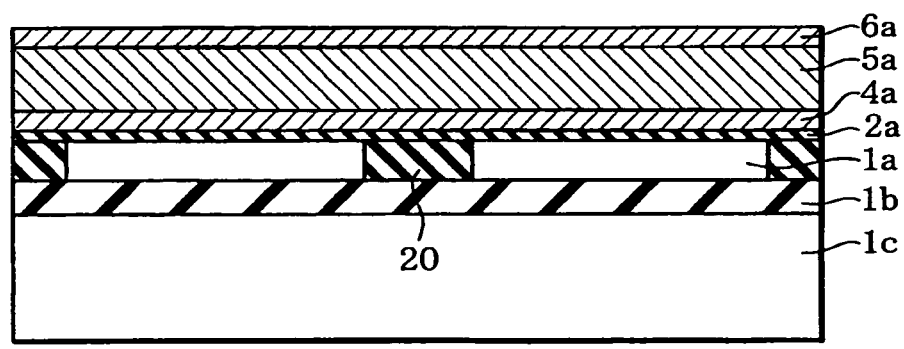
FIG. 3 is a cross sectional view showing a method of manufacturing a semiconductor device related to the preferred embodiment.

(b) As shown in FIG. 3, an insulating layer 2a to be a gate-insulating layer is formed by a thermal oxidation method, or a CVD method. The thickness of the insulating layer 2a is 3 nm. As the insulating layer 2a, a single layer of silicon oxide, silicon nitride and silicon oxynitride or a multi-layered film including them can be used.

Further, a tantalum nitride layer 4a, a tantalum layer of a body centered cubic lattice phase 5a and a cap layer 6a are deposited sequentially in this order with a sputtering method by using a xenon gas.

It is desirable that the tantalum nitride layer 4a is composed of $TaN_x$ where the composite ratio of nitride to tantalum, x is 0.25 through 1.0, viewed from conductivity and threshold characteristics.

In addition, the cap layer 6a can be formed with TaNx, $TaSi_xNy$, $TiN_x$, $TiAl_xN_y$, Si and materials consisting of at least one kind selected from silicide of transition metals. Especially, the tantalum nitride ($TaN_x$), which is very resistant to a cleaning chemicals (acid, alkali) is preferable. In this embodiment, the tantalum nitride layer is used as the cap layer 6a. The tantalum nitride layer 6a functions as the cap layer, which prevents oxidation of the tantalum layer 5a in a process after etching of a gate electrode.

In sputtering, xenon having larger mass is used instead of argon, which is normally used, so as to avoid any damages or defects on the gate insulating layer 2a and the silicon layer 1a as a base layer. Hence, it can give energy only to the surface of a layer to be formed. In other words, an atomic radius of xenon is 0.217 nm while that of argon is 0.188 nm such that it is hard for xenon to penetrate into the inside of a layer, giving energy on the surface of a layer efficiently. Further, atomic weight of argon is 39.95, and atomic weight of xenon is 131.3, namely, atomic weight of xenon is larger than that of argon. Hence, it may be said that propagation efficiency of energy and momentum in xenon is low in comparison with that on argon, being hard to make a defect and damage. Therefore, when xenon is used, tantalum nitride layers 4a, 6a and a tantalum layer 5a can be formed without giving a defect and a damage to the gate insulating layer 2a in comparison with argon. This behavior is similar to krypton.

In this embodiment, it was confirmed that the tantalum layer of the body centered cubic lattice phase 5a is formed by hetero epitaxy growth with lattice arrangement on the tantalum nitride 4a, if the above-mentioned method is adopted. Tantalum of a body centered cubic lattice phase has low resistance, in comparison with β tantalum, such that it is suited for an electrode material. In detail, the resistance of tantalum of a body centered cubic lattice phase can be around one tenth of that of β tantalum.

Furthermore, it is desirable that the tantalum nitride layer 4a, the tantalum 5a of a body centered cubic lattice phase and the tantalum nitride 6a are formed without being exposed to an atmosphere. When a film is exposed to the atmosphere on the way of forming a film, water is adhered and the surface of a film is oxidized.

Figure 4:
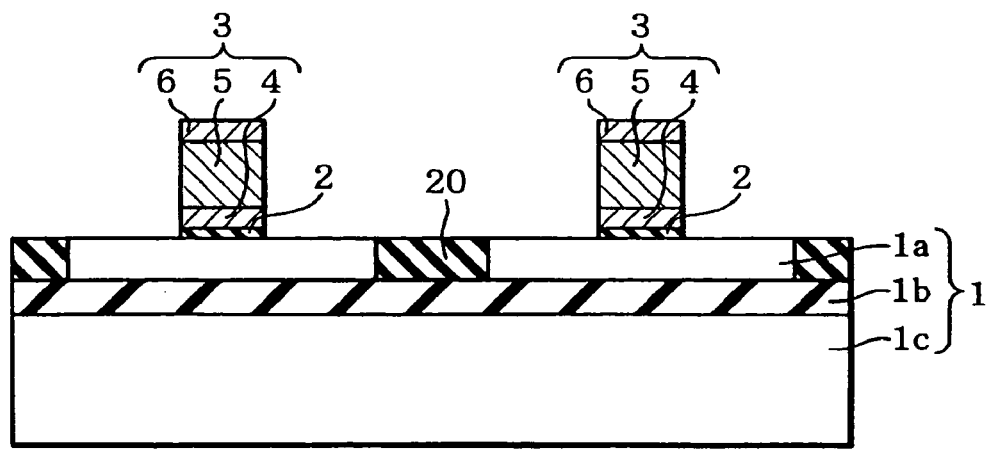
FIG. 4 is a cross sectional view showing a method of manufacturing a semiconductor device related to the preferred embodiment.

(c) As shown in FIG. 4, the gate electrode 3 is formed by patterning the tantalum nitride 4a, the tantalum layer 5a and tantalum nitride 6a with lithographic technology and dry etching technology. In other words, the gate electrode 3 has a multi-layered structure comprising the tantalum nitride 4 as a base, the tantalum of a body centered cubic lattice phase 5 and the tantalum nitride 6 as a cap. In this case, the gate-insulating layer 2 is formed by patterning the insulating layer 2a.

One of the features of this embodiment is that a specific gas is used in dry etching of this patterning. In this production process, after a predetermined patterned resist layer is formed (not shown) by lithography, two stages of etching are continuously performed.

At first, as a first stage etching, reactive ion etching is implemented by using gas including $NF_3$ and a fluorocarbon ($CF_4$ or $C_2F_6$). As one example of etching conditions, it can be adopted that a flow rate of $NF_3$ to $CF_4$ (sccm) ($CF_4/NF_3$) is 70/30, pressure; 4 m Torr, substrate temperature; 50° C., and RF bias; 191 mW/cm$^2$. The etching rate of tantalum is 100 nm/minute at this time. In this first stage etching, most of the tantalum nitride layer 6a and the tantalum layer 5a (around 70–80% of the thickness) are etched. Hence, etching time can be shortened since a tantalum layer 5a is etched by using a fluorocarbon, of which etching rate toward tantalum is larger than that of other gases and $NF_3$ of which dependency on a crystal surface is small.

Next, as a second stage etching, reactive ion etching is implemented by using a gas including $SiCl4$ and $NF_3$. In this second stage etching, the flow rate (sccm) of $NF_3$ to the sum of $SiCl_4$ and $NEF_3$ ($NF_3/(SiCl_4+NF_3)$) is preferably 1 to 30%, more preferably 5 to 25%. If the above ratio is within the above range, the selective ratio to the insulating layer 2a can be sufficiently large, so as to process a sidewall of a conductive layer to be vertical or almost vertical.

As one example of etching conditions, the ratio of the flow rate of $NF_3$ to a mixed gas of $SiCl_4$ and $NF_3$ is 15%, pressure; 9 mTorr, substrate temperature; 50° C., and RF bias; 127 mW/cm$^2$. Etching rate of tantalum is 40 nm/minute at these conditions.

In the second stage etching, the sidewall of the tantalum layer 5a and tantalum nitride 4a are etched vertically or almost vertically. This may be caused by the following reasons. A reactive material generated by $NF_3$ and/or $SiCl_4$ is accumulated in the sidewall of the conductive layer. A reactive material accumulated in the sidewall of the conductive layer, functions as a protective layer for the sidewall of the conductive layer and etches the sidewall of the conductive layer vertically or almost vertically. In addition, $NF_3$ can etch the crystal surface with a uniform rate since crystal surface dependency on tantalum is small. Further, a compound including Si and N is accumulated on the insulating layer 2a since $SiCl_4$ and $NF_3$ coexist. Hence, a selective ratio of the tantalum layer 5a and the tantalum nitride 4a to the insulating layer 2a can be increased.

On the other hand, when anisotropic etching under the above conditions is not implemented, the gate electrode is not processed vertically or almost vertically. In other words, the sidewall of the gate electrode is tapered. This means inaccurate copying of a mask configuration for etching to a material to be etched. Therefore, the gate electrode cannot be processed with a desired gate length.

Furthermore, when an impurity is injected with ion implantation while being self-aligned with a tapered gate electrode as a mask, a desirable impurity density profile cannot be obtained. Therefore, this gives adverse effect to the next step for forming a source and drain region in a semiconductor layer.

Subsequently, the gate insulating layer 2a is patterned by changing an etching gas to form the gate-insulating layer 2.

Figure 5:
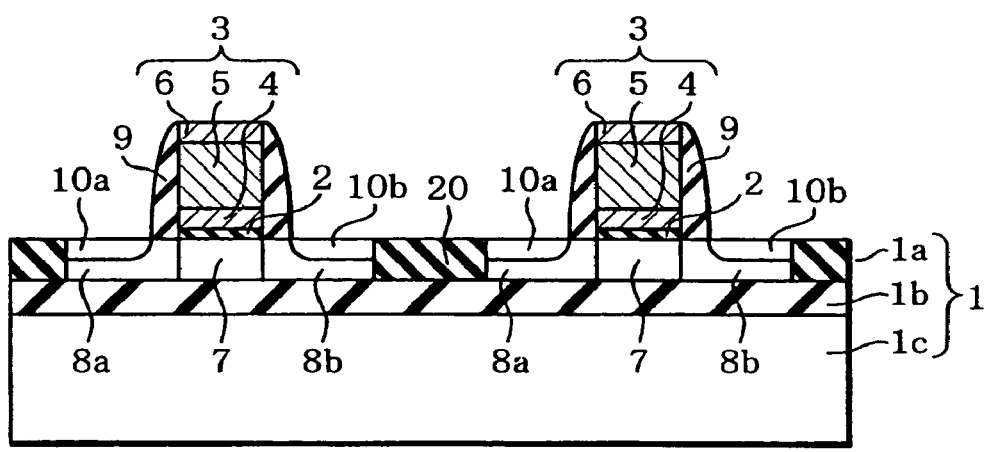
FIG. 5 is a cross sectional view showing a method of manufacturing a semiconductor device related to the preferred embodiment.

(d) Next, as shown in FIG. 5, arsenic ion or phosphor ion is injected to a NMOSFET and boron ion or boron difluoride ion is injected to a PMOS FET with the gate electrode 3 as a mask such that its density is greater than $10^{20}$ cm$^{-3}$. When the impurity layer of NMOSFET and PMOSFET is formed, a mask layer such as a resist layer (not shown) is formed in a predetermined region to avoid doping impurity ions of reversed polarity. Then, impurity layers 8a, and 8b can be formed with self-alignment by low temperature annealing under 700° C., preferably a range of 450° C. to 550° C.

Next, after a silicon oxide layer is accumulated entirely over the SOI substrate 1 by a CVD (Chemical Vapor Deposition) method, it is etched back by a dry etching method so as to form a sidewall spacer 9.

Further, a transition metal layer, such as a Ni layer, for example, is formed by a spattering method. Then nickel silicide layers 10a and 10b are formed at the exposed area of the impurity layers 8a and 8b after annealing. As a transition metal, a material to be silicide such as titanium or cobalt is preferable. Then, a transition metal layer, which did not react on the side wall 9 is removed by acid such as sulfuric acid and silicide layers 10a and 10b are formed with self-alignment.

Figure 6:
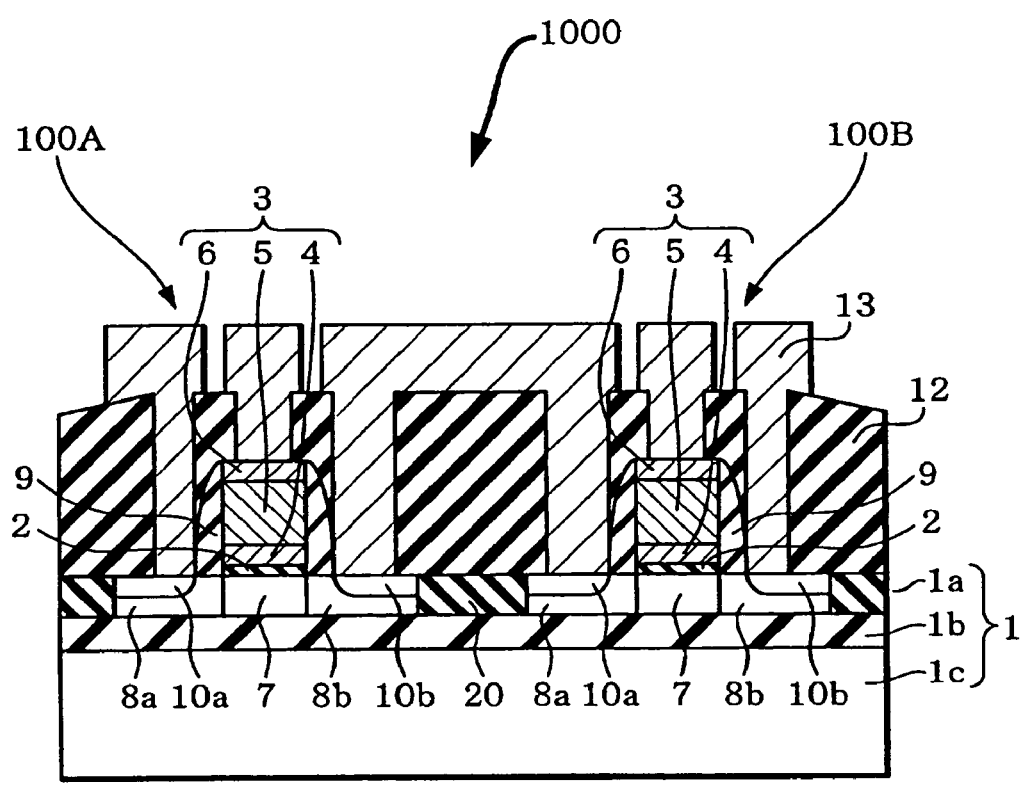
FIG. 6 is a cross sectional view showing a method of manufacturing a semiconductor device related to the preferred embodiment.

(e) As shown in FIG. 6, an interlayer insulation layer 12 and an electric wiring layer 13 are formed through a process of normal CMOS processing and wiring so as to complete the semiconductor device 1000.

According to a method of processing this semiconductor device, the following advantages are provided.

When etching a tantalum layer, a gas including $SiCl_4$ and $NF_3$ is used, enabling a tantalum layer to be etched quickly with a preferable configuration while maintaining a high selective ratio to an insulating layer. In addition, before etching using a gas including $SiCl_4$ and $NF_3$, a gas including $NF_3$ and fluorocarbon ($CF_4$ or $C_2F_6$) is used, so as to shorten all etching times.

In addition, it is advantageous in that following when the tantalum nitride layer 4 is provided close to the gate insulating layer 2. The work function of the tantalum nitride is about 4.5 eV, which is close to the mid gap energy of intrinsic silicon 4.61 eV. As a result, the increase of the absolute value of the flat band voltage in a MOS capacitor is small, such that it is not necessary to increase the density of an impurity doped into a channel region to control the threshold value. Therefore, degradation of carrier mobility can be prevented such that a MOSFET provided with high current drive capability can be obtained with high yield.

Furthermore, practical examples to verify advantages in the invention are described.

Figure 7:
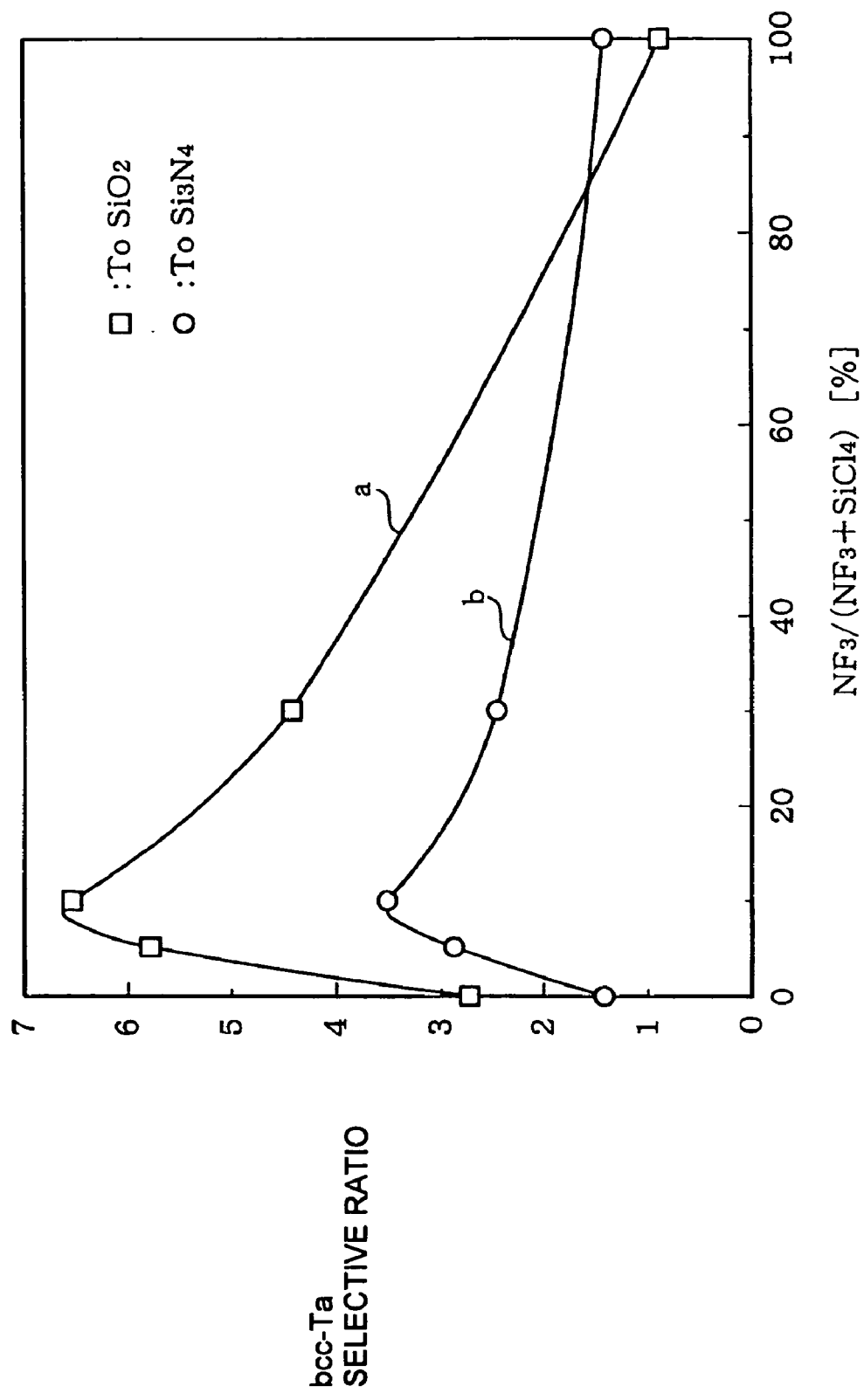
FIG. 7 is a diagram showing a relationship between gas composition for etching and selective ratio.

(1) The Relationship of the Selective Ratio Between an Insulator and a Tantalum of Body Centered Cubic Lattice Phase FIG. 7 shows the relationship between the flow rate of $NF_3$ to a mixed gas ($NF_3+SiCl_4$) used in the second stage etching and the selective ratio of a tantalum of a body centered cubic lattice phase (referred to as "bcc-tantalum" hereafter) to an insulating material (oxide silicon or nitride silicon), which were obtained by an experiment. In FIG. 7, a curve shown as "a" indicates the selective ratio (arbitrary unit) of a tantalum to a silicon oxide and a curve shown as "b" indicates the selective ratio (arbitrary unit) of a tantalum to a silicon nitride.

The conditions of reactive ion etching were pressure=9 mTorr, substrate temperature=50° C. and RF bias=55 mW/cm². In addition, in this sample, a silicon oxide layer or a silicon nitride layer having a thickness of 3 nm is formed on a silicon substrate. Further, a tantalum nitride having a thickness of 30 nm, and a tantalum layer of a body centered cubic lattice having a thickness of 100 nm was formed. A silicon oxide layer is formed by thermal oxidation of 1000° C. In addition, a silicon nitride layer is formed by a high-density plasma CVD method in the ambient atmosphere with ammonia and argon gas.

FIG. 7 shows that a flow rate of $NF_3$ to a mixed gas ($NF_3+SiCl_4$) is 1 to 30%, more preferably 5 to 25%, when the selective ratio is sufficiently high. In addition, the sidewall of a etched layer is almost vertical.

(2) A Relationship of Selective Ratio of an Insulating Layer to a bcc-Tantalum

Figure 8:
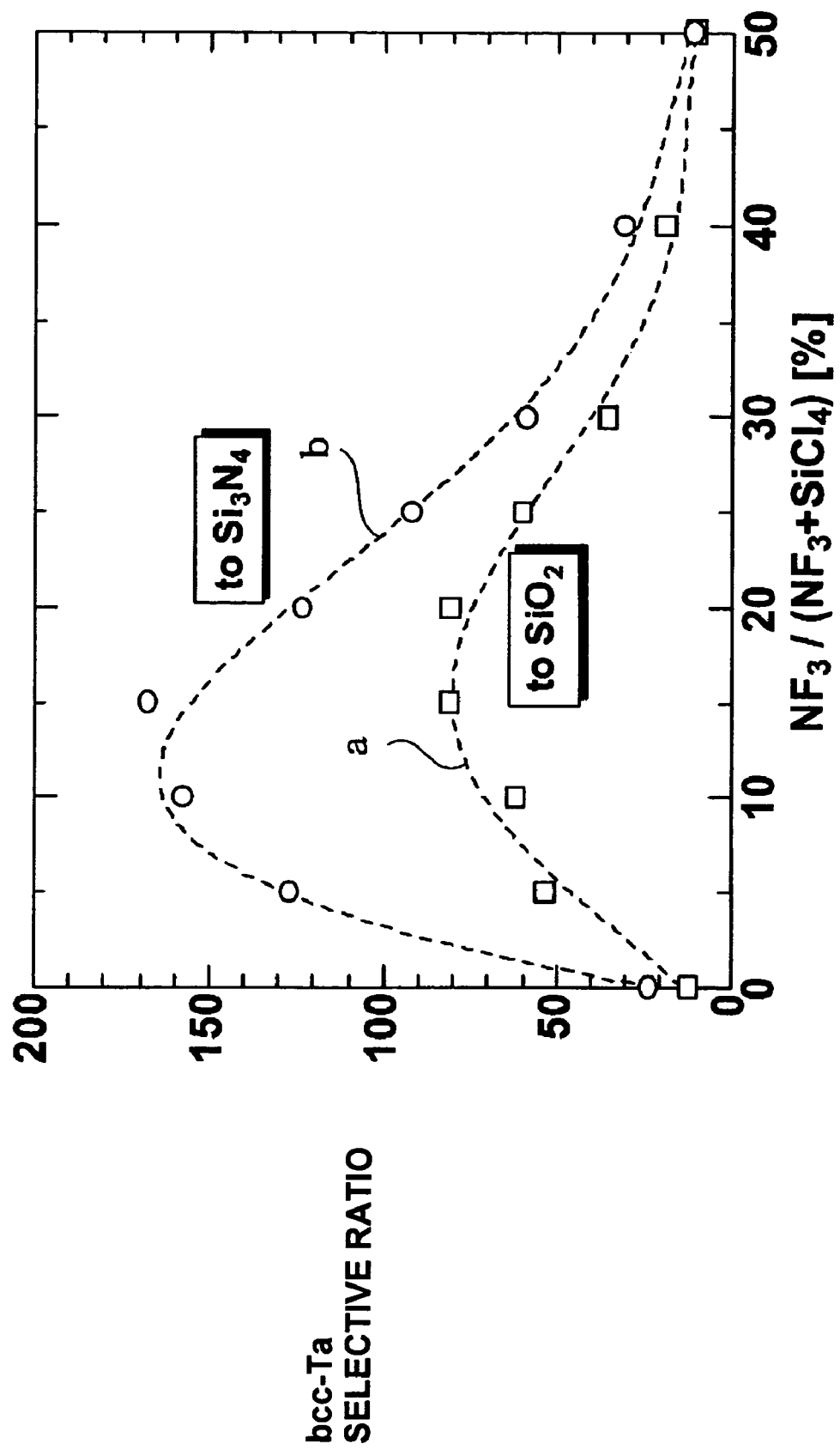
FIG. 8 is a diagram showing a relationship between gas composition for etching and selective ratio.

FIG. 8 shows a result of the similar experiment under the etching condition of RF bias, which differs from the example in FIG. 7. In other words, FIG. 8 is a diagram showing the relationship between the flow rate of $NF_3$ to a mixed gas ($NF_3+SiCl_4$) used in etching and the selective ratio of a insulating material (silicon oxide or silicon nitride) to a bcc-tantalum. In FIG. 8, a curve shown as "a" indicates the selective ratio of a tantalum to a silicon oxide and a curve shown as "b" indicates the selective ratio of a tantalum to a silicon nitride.

The conditions of reactive ion etching were pressure=9 mTorr, substrate temperature=50° C., and RF bias=127 mW/cm². In addition, in this sample, a silicon oxide layer or a silicon nitride layer of which thickness is 3 nm was formed on a silicon substrate. Further, a bcc-tantalum layer having a thickness of 100 nm was formed by sputtering. The silicon oxide layer was formed by thermal oxidation of 750° C. In addition, the silicon nitride layer was formed by a high-density plasma CVD method in an ambient atmosphere with ammonia and argon gas.

FIG. 8 shows that a flow rate of $NF_3$ to a mixed gas ($NF_3+SiCl_4$) is 1 to 30%, more preferably 5 to 25%, when the selective ratio is sufficiently high. In particular, in case of a silicon oxide layer, this flow rate is preferably 5 to 25% when the preferable selective ratio is considered to be more than 50 in the example shown in FIG. 8, for example. In addition, in case of a silicon nitride layer, this flow rate is preferably 1 to 30%, when the preferable selective ratio is considered to be more than 50 in the example shown in FIG. 8, for example, more particularly 5 to 25% when the preferable selective ratio is considered to be more than 100 in the example shown in FIG. 8, for example.

(3) A Relationship of Selective Ratio of an Insulator to Tantalum Nitride

Figure 9:
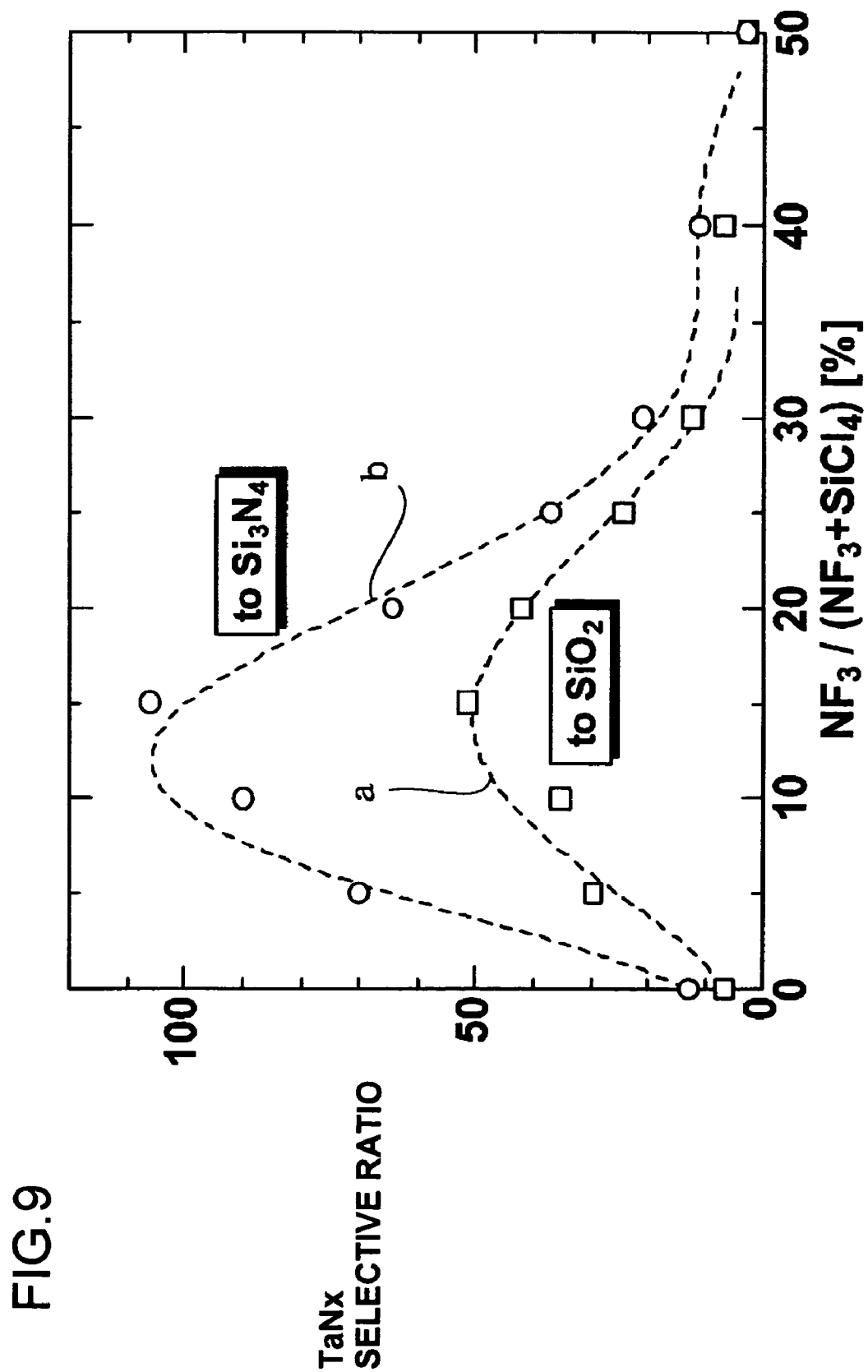
FIG. 9 is a diagram showing a relationship between gas composition for etching and selective ratio.

FIG. 9 shows the relationship between the flow rate of $NF_3$ to a mixed gas ($NF_3+SiCl_4$) used in etching and the selective ratio of a tantalum nitride to an insulating material (silicon oxide or silicon nitride). In FIG. 9, the curve shown as "a" indicates the selective ratio of a tantalum nitride to a silicon oxide and a curve shown as "b" indicates the selective ratio of a tantalum nitride to a silicon nitride.

The conditions of reactive ion etching were pressure 9 mTorr, substrate temperature 50° C. RF bias 127 mW/cm². In addition, in this sample, a silicon oxide layer or a silicon nitride layer of which thickness is 3 nm, was formed on a silicon substrate. Further, a tantalum nitride of which thickness is 100 nm was formed by sputtering. The silicon oxide layer was formed by thermal oxidation of 750° C. In addition, the silicon nitride layer was formed by a high-density plasma CVD method in an ambient atmosphere with ammonia and argon gas.

FIG. 9 shows that a flow rate of $NF_3$ to a mixed gas ($NF_3+SiCl_4$) is 1 to 30%, more preferably 5 to 25%, when the selective ratio is sufficiently high. In particular, in case of a silicon oxide layer, this flow rate is preferably 5 to 25% when the preferable selective ratio is considered to be more than 20 in the example shown in FIG. 9, for example. In addition, in case of a silicon nitride layer, this flow rate is preferably 1 to 30%, when the preferable selective ratio is considered to be more than 20 in the example shown in FIG. 9, for example. 5 to 25% is more preferable when the preferable selective ratio is considered to be more than 50 in the example shown in FIG. 9, for example.

(4) Observation of Configuration with SEM

Figure 10:
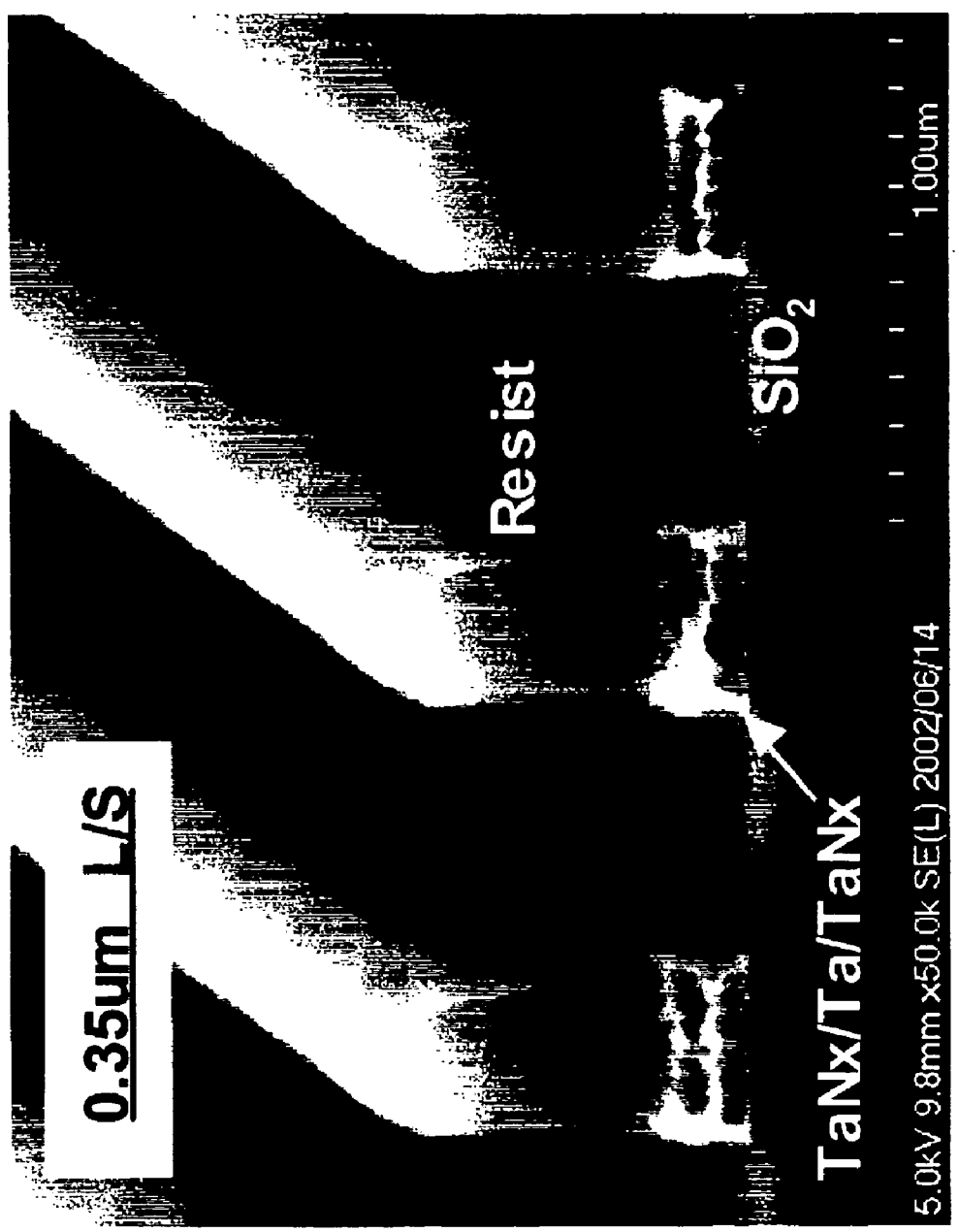
FIG. 10 is a diagram showing a photograph taken by a scanning electron microscope.

Reactive ion etching was completed with a mixed gas of $SiCl_4$ and $NF_3$ by using a sample formed by the following method. As etching conditions, a flow rate of $NF_3$ to a mixed gas with $SiCl_4$ and $NF_3$; 10%, a pressure; 9 mTorr, substrate temperature; 50° C., and RF bias; 127 mW/cm² were adopted. The etching rate of tantalum is around 40 nm/minute at this time. FIG. 10 shows a photograph of the sample obtained as the result of the above etching via a scanning electron microscope (SEM).

According to the present embodiment, it was confirmed in FIG. 10 that the sidewall of multi-layered film comprising a tantalum nitride layer, a bcc-tantalum layer and a tantalum nitride layer was etched almost vertically (89°). Here, in the example of FIG. 10, the spacing per a line of a multi-layered film was 3.5–μm.

The sample of the present embodiment was provided by the following method. A silicon oxide layer is formed by a thermal oxidation method to form a gate-insulating layer. The thickness of the silicon oxide layer is 3 nm. Next, a tantalum nitride layer (thickness; 30 nm), a bcc-tantalum layer (thickness; 100 nm) and a tantalum nitride layer as a cap layer (thickness; 30 nm), were formed sequentially in this order. A predetermined patterned resist layer is formed on the multi-layered film obtained by the above method and this film is etched by the above ion etching.

(5) A Relationship Between Etching and an Accumulated Material

Figure 11:
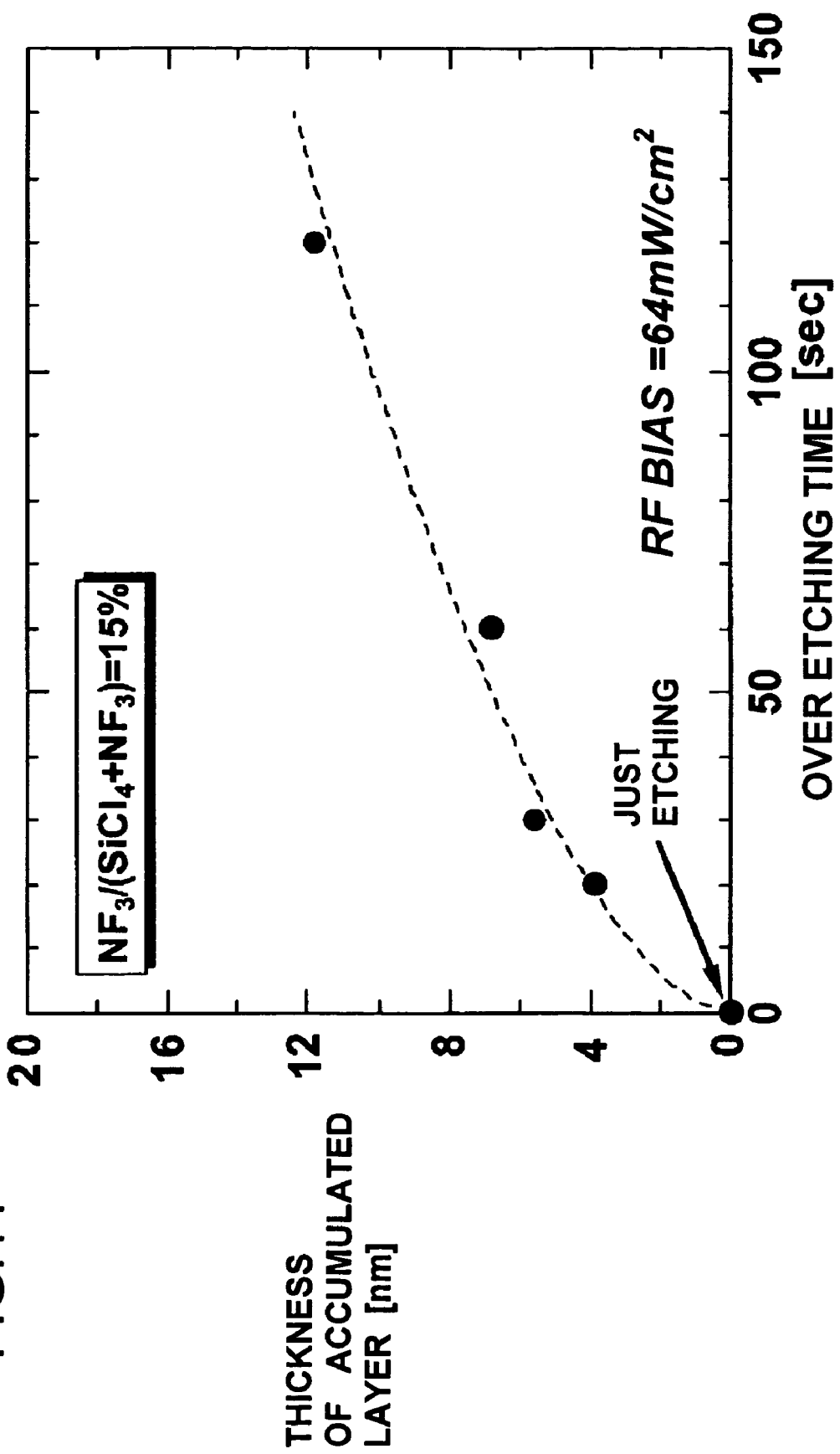
FIG. 11 is a diagram showing a relationship of over etching time and the thickness of an accumulation layer.

FIG. 11 is a diagram, which shows a relationship between an accumulated layer and time of over etching under etching with using a mixed gas of $SiCl_4$ and $NF_3$. In FIG. 11, a horizontal scale shows over etching time and a vertical scale shows the thickness of an accumulated layer. In this practical example, it was confirmed that an accumulated layer depends upon RF bias by the following approach. At first, a sample, a bcc-tantalum layer was etched and over-etched further. Then, a thickness of a newly accumulated layer was measured.

As a sample, a silicon nitride layer (thickness; 3 nm) is formed on a silicon substrate; a tantalum nitride layer (thickness; 30 nm) and a bcc-tantalum layer (thickness; 100 nm) are formed in this order. The conditions of reactive ion etching of the bcc-tantalum layer and the tantalum nitride layer were pressure; 9 mTorr, substrate temperature; 50° C., and RF bias; $64$ mW/cm$^2$. In addition, the flow ratio of $NF_3$ to a mixed gas with $SiCl_4$ and $NF_3$ was 15%.

In FIG. 11, it was confirmed that forming an accumulated layer (in the other words, accumulation of reactive material) was started at the time when etching of a bottom tantalum nitride layer is finished under the etching conditions of the present example. Then, it was understood that the accumulated layer thickened along with over etching time. This accumulated layer seemed to be formed due to $SiCl_4$ at least. In the present embodiment, RF bias is small in comparison with the above examples (2) to (4), and anisotropic etching becomes weaker than these practical examples such that an accumulated layer is easily formed. Hence, it is desirable that RF bias is set based on the consideration of etching rate and formation speed of an accumulated material.

(6) Vg-Id Characteristic of a Transistor

Figure 12:
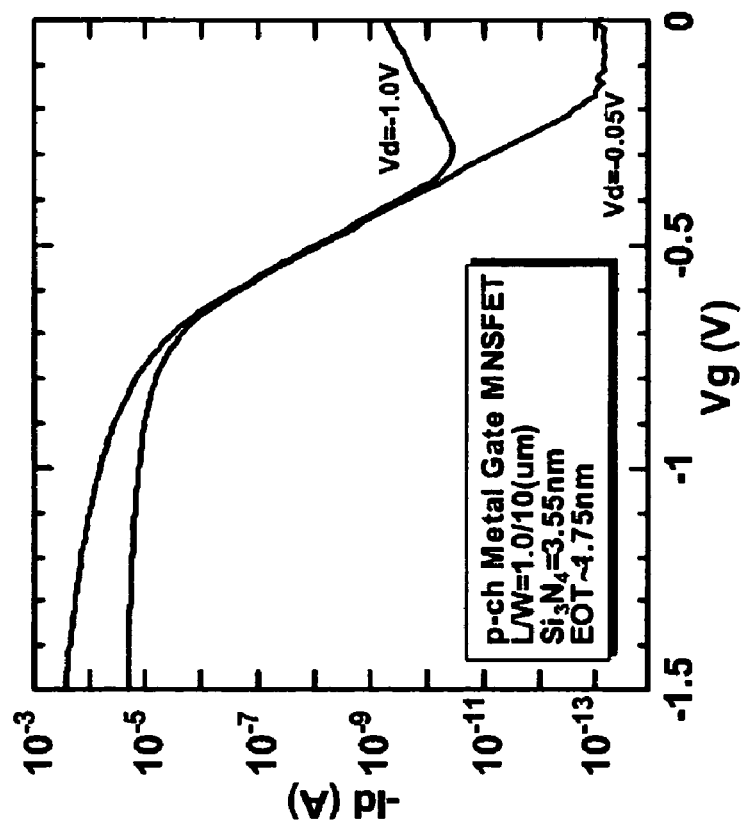
FIG. 12(A) and FIG. 12(B) show diagrams showing Id-Vg characteristics of a transistor.
Figure 12:
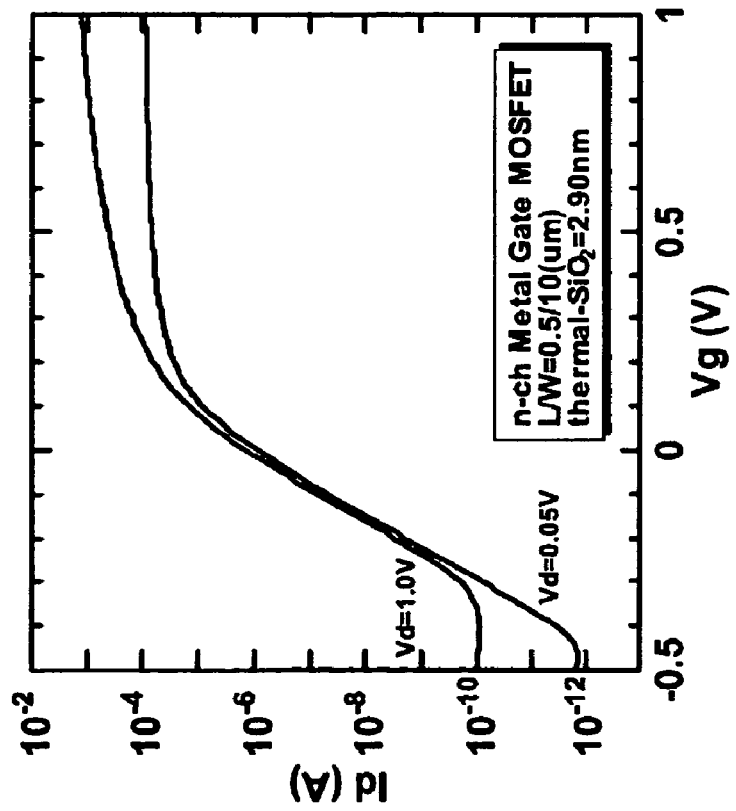

FIG. 12(A) and FIG. 12(B) show the Vg-Id characteristic of a transistor related to the present embodiment. FIG. 12(A) shows a Vg-Id characteristic of n-channel MOSFET and FIG. 12(B) shows a Vg-Id characteristic of a p channel MNSFET. Both transistors have a multi-layered structure comprising a tantalum nitride (thickness; 30 nm), a bcc-tantalum layer (thickness; 100 nm) and a tantalum nitride layer as a cap (thickness; 30 nm). In addition, a n-channel MOSFET has a silicon oxide layer formed as gate insulator by thermal oxidation (thickness; 2.9 nm). A p channel MNSFET, has a silicon nitride layer (thickness 3.55 nm) as gate insulator, formed with high-density plasma CVD under an ammonia—argon ambient atmosphere. The equivalent oxide thickness (EOT) of this silicon nitride layer is 1.75 nm.

In FIG. 12(A) and FIG. 12(B), it was confirmed that a preferable Vg-Id characteristic was shown in both a p channel MNSFET and a n-channel MOS FET.

(7) Off-State Current Characteristic of a Transistor

Figure 13:
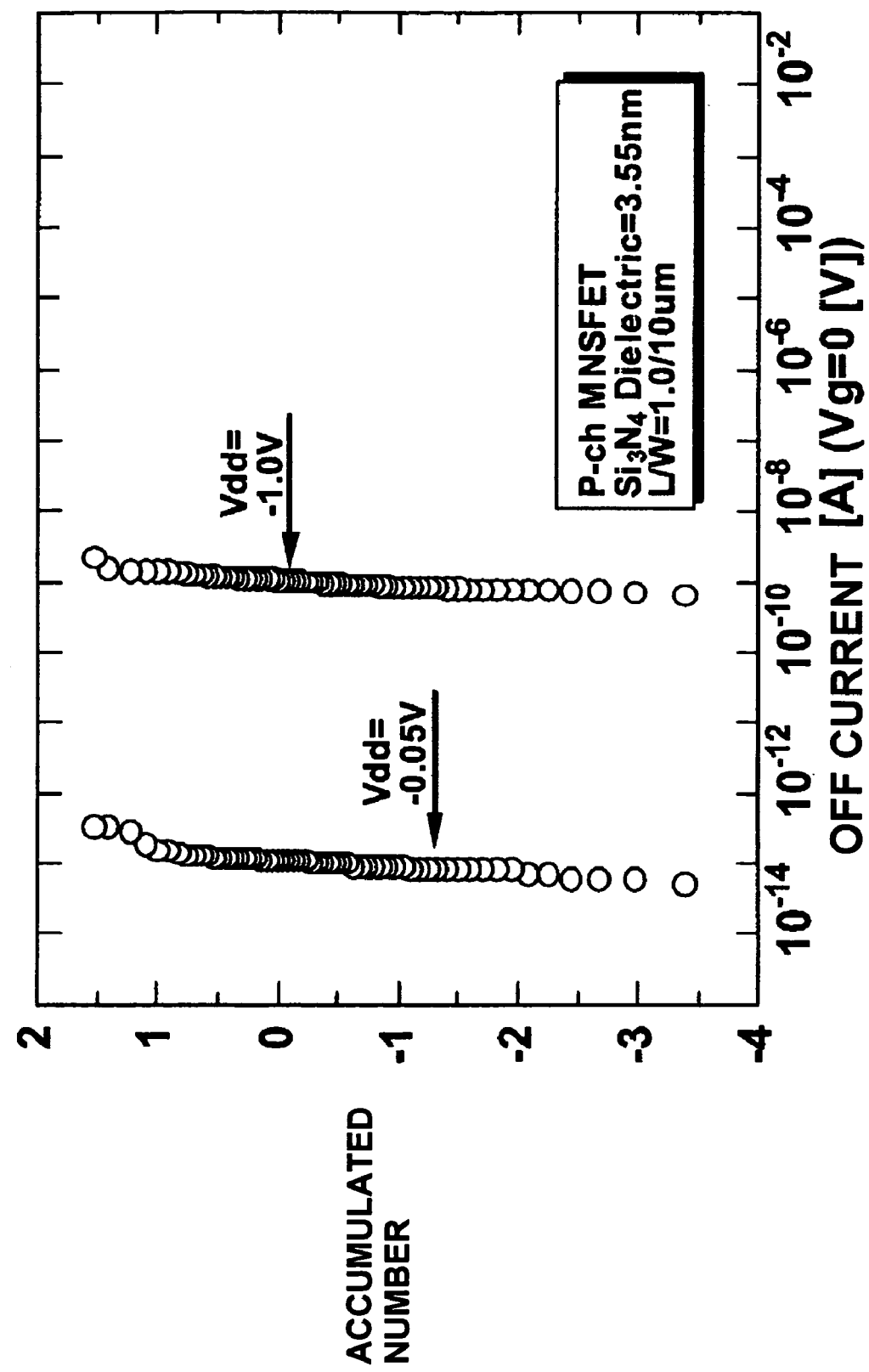
FIG. 13 is a diagram showing relationship between off state current of a transistor and accumulated numbers.

FIG. 13 is a diagram showing off-state current characteristic in a p channel MNSFET that was used in measurement of the above (6) Vg-Id characteristic. In FIG. 13, a horizontal scale shows off-state current and a vertical scale shows the number of Weibull accumulation (the weibull plots obtained by [ln(−ln(1−F))]). In the present embodiment, off-state current was obtained about 60 points of MNSFET in 6-inch wafer.

In FIG. 13, it was confirmed that there was an extremely little fluctuation of off-state current in a MNSFET of the present embodiment and a gate electrode was uniformly etched with high selective ratio.

Furthermore, the present inventor did the following experiments for comparison.

Figure 14:
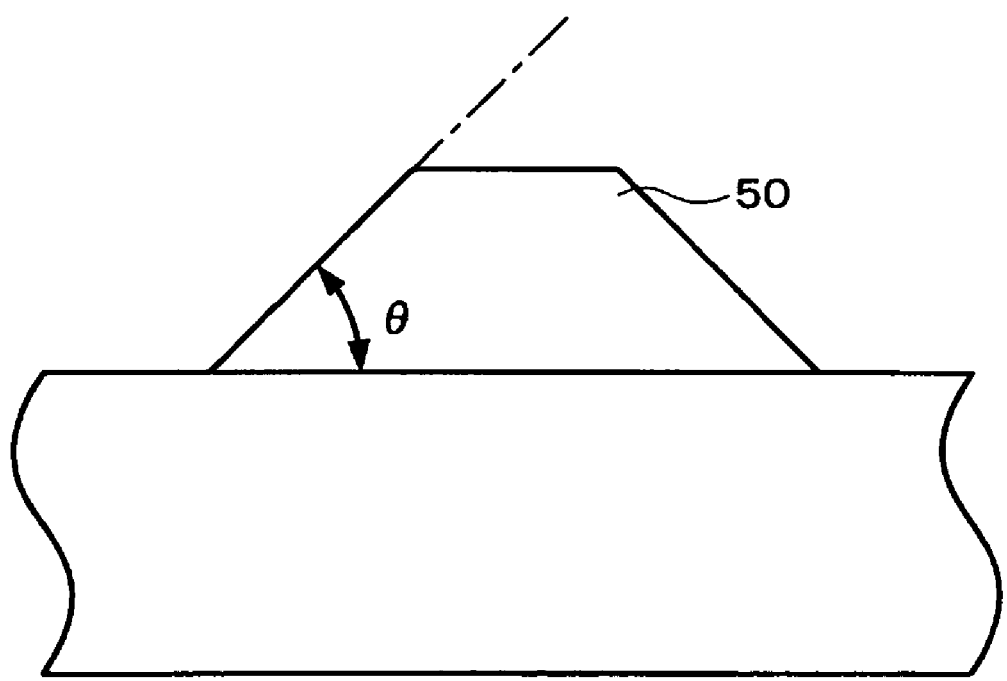
FIG. 14 is a diagram showing an etched conductive layer regarding comparative examples.

At first, in etching of electrically conducting layer (tantalum), SF 6 was used instead of $NF_3$. As a result, SF 6 showed high rate of isotropic etching in comparison with $NF_3$. As a result, as shown in FIG. 14, an etched conducting layer (the tantalum layer) 50 is tapered. It was confirmed that this tapered angle is about 60°. Therefore it is preferable that $NF_3$ is used in a process of etching a sidewall of a conducting layer. In addition, as etching gas, $Cl_2$ was employed instead of $SiCl_4$. As a result, it was confirmed that there was insufficient amount of accumulated material at a sidewall of a conducting layer such that a selective ratio in practical use cannot be obtained regarding a conductive layer and a silicon oxide layer.

Detailed description of the preferred embodiments of the present invention have been described. But, other aspects can be considered within the range of the sprite of the present invention.

For example, a gate electrode is not limited to a multi-layered structure comprising a tantalum nitride layer and a tantalum layer. A gate electrode may comprises a single metal layer such as tantalum, tungsten, molybdenum, chromium, niobium, vanadium, titanium, zirconium, a single nitride layer with one of these metals, or a multi-layered structure including a layer of one of these metals and a single nitride layer with one of these metals.

Furthermore, an etched conductive layer is preferably used as a gate electrode, but may be used as other wiring layers.

What is claimed is:

1. A process of manufacturing a semiconductor device comprising:

forming an insulating layer above a semiconductor layer;

forming a conductive layer including a tantalum layer and a tantalum nitride layer, the conductive layer having a sidewall; and etching the conductive layer by using a gas including $SiCl_4$ and $NF_3$, wherein; a reactive material accumulates in the sidewall of the conductive layer to function as protection and the ratio of the flow rate of the $NF_3$ to the flow rate of the sum of the $SiCl_4$ and the $NF_3$ is approximately 1 to approximately 30% such that an angle between the sidewall of the etched conductive layer and the insulating layer is 85 to 90 degrees.

2. The process of manufacturing a semiconductor device claimed in claim 1 wherein; the insulating layer includes at least one of silicon oxide, silicon nitride and silicon oxynitride.

3. A process of manufacturing a semiconductor device comprising:

forming an insulating layer above a semiconductor layer;

forming a conductive layer including at least one of a tantalum layer and a tantalum nitride layer;

etching the conductive layer by using a gas including $NF_3$ and $C_2F_6$ such that approximately 70–80% of the tantalum layer and the tantalum nitride layer are etched; and subsequently etching the conductive layer again by using a gas including $SiCl_4$ and $NF_3$, wherein; the ratio of the flow rate of the $NF_3$ to the flow rate of the sum of the $SiCl_4$ and the $NF_3$ is approximately 1 to approximately 30% such that the conductive layer is etched to be approximately 89 degrees.

4. The process of manufacturing a semiconductor device claimed in claim 3 wherein; the insulating layer includes at least one of silicon oxide, silicon nitride and silicon oxynitride.

5. A process of manufacturing a semiconductor device comprising:

forming an insulating layer above a semiconductor layer;

forming a first tantalum nitride layer, body centered cubic lattice phase tantalum layer and a second tantalum nitride layer in this order;

forming a gate electrode by etching the first tantalum nitride layer, the body centered cubic lattice phase tantalum layer and the second tantalum nitride layer with using a gas including $SiCl_4$ and $NF_3$; and forming first and second impurity layers constituting a source region and a drain region through introducing a impurity into the semiconductor layer, wherein;

the ratio of the flow rate of the $NF_3$ to the flow rate of the sum of the $SiCl_4$ and the $NF_3$ is approximately 1 to approximately 30% such that the conductive layer is etched to be 90 degrees.

* * * * *